(12) United States Patent
van Kesteren

(10) Patent No.: US 7,217,670 B2
(45) Date of Patent: May 15, 2007

(54) DUMMY SUBSTRATE FOR THERMAL REACTOR

(75) Inventor: Tom A. van Kesteren, Bilthoven (NL)

(73) Assignee: ASM International N.V. (NL)

( * ) Notice: Subject to any disclaimer, the term of this patent is extended or adjusted under 35 U.S.C. 154(b) by 0 days.

(21) Appl. No.: 10/995,904

(22) Filed: Nov. 22, 2004

(65) Prior Publication Data
US 2006/0110944 A1    May 25, 2006

(51) Int. Cl.
    *H01L 21/00*    (2006.01)
(52) U.S. Cl. ............ 438/795; 156/345.27; 156/345.37; 156/345.24; 257/E21.001
(58) Field of Classification Search .............. 438/795, 438/689, 715; 118/725; 156/345.27, 345.37; 204/192.1, 298.01, 298.31; 216/58, 63, 67
See application file for complete search history.

(56) References Cited

U.S. PATENT DOCUMENTS

| | | |
|---|---|---|
| 3,947,236 A | 3/1976 | Lasch, Jr. |
| 4,346,433 A | 8/1982 | Rutledge |
| 4,385,362 A | 5/1983 | Arcara |
| 4,495,024 A | 1/1985 | Bok |
| 4,560,590 A | 12/1985 | Bok |
| 4,575,408 A | 3/1986 | Bok |
| 4,630,189 A | 12/1986 | Ohmori et al. |
| 4,639,853 A | 1/1987 | Rake et al. |
| 4,738,748 A | 4/1988 | Kisa |
| 4,860,687 A | 8/1989 | Frijlink |
| 4,975,561 A | 12/1990 | Robinson et al. |
| 5,178,639 A | 1/1993 | Nishi |
| 5,180,273 A | 1/1993 | Sakaya et al. |
| 5,314,848 A | 5/1994 | Yasui et al. |
| 5,332,442 A | 7/1994 | Kubodera et al. |
| 5,407,449 A | 4/1995 | Zinger |
| 5,411,076 A | 5/1995 | Matsunaga et al. |
| 5,414,244 A | 5/1995 | Imahashi |

(Continued)

FOREIGN PATENT DOCUMENTS

EP    08236533    9/1996

(Continued)

OTHER PUBLICATIONS

Porter, et al., Fast-ramp rapid vertical processor for 300-mm Si wafer processing. SPIE vol. 3507, p. 42-53, Sep. 1998.

*Primary Examiner*—Michelle Estrada
*Assistant Examiner*—Jarrett J. Stark
(74) *Attorney, Agent, or Firm*—Knobbe Martens Olson & Bear LLP

(57) ABSTRACT

A single substrate reactor system for processing batches of product substrates one at a time is provided with at least one dummy substrate. In the time after one batch of product substrates is processed and before another batch of product substrates is ready for processing, the dummy substrate is used as a substitute for the thermal load presented by a product substrate. The dummy substrate is loaded into and unloaded from the reactor in the same manner as a batch of product substrates. Advantageously, the thermal load presented by the dummy substrate maintains the thermal equilibrium established during the processing of a batch of product substrates, thereby eliminating the need for and time required to re-establish this equilibrium at the beginning of processing the next batch of substrates.

35 Claims, 6 Drawing Sheets

U.S. PATENT DOCUMENTS

| | | | |
|---|---|---|---|
| 5,430,271 A | 7/1995 | Orgami et al. | |
| 5,431,700 A | 7/1995 | Sloan | |
| 5,464,313 A | 11/1995 | Ohsawa | |
| 5,516,283 A * | 5/1996 | Schrems | 432/241 |
| 5,635,409 A | 6/1997 | Moslehi | |
| 5,650,082 A | 7/1997 | Anderson | |
| 5,790,750 A | 8/1998 | Anderson | |
| 5,855,681 A | 1/1999 | Maydan et al. | |
| 5,925,212 A * | 7/1999 | Rice et al. | 156/345.27 |
| 5,997,588 A | 12/1999 | Goodwin et al. | |
| 6,001,175 A | 12/1999 | Maruyama et al. | |
| 6,018,616 A | 1/2000 | Schaper | |
| 6,064,799 A | 5/2000 | Anderson et al. | |
| 6,072,163 A | 6/2000 | Armstrong et al. | |
| 6,080,969 A | 6/2000 | Goto et al. | |
| 6,097,005 A | 8/2000 | Akimoto | |
| 6,099,056 A | 8/2000 | Siniaguine et al. | |
| 6,111,225 A | 8/2000 | Ohkase et al. | |
| 6,128,586 A | 10/2000 | Pfeiffer | |
| 6,183,565 B1 | 2/2001 | Granneman et al. | |
| 6,207,936 B1 | 3/2001 | de Waard et al. | |
| 6,215,106 B1 | 4/2001 | Boas et al. | |
| 6,222,164 B1 | 4/2001 | Stoddard et al. | |
| 6,234,788 B1 | 5/2001 | Lee | |
| 6,275,744 B1 | 8/2001 | Yoshida | |
| 6,329,304 B1 | 12/2001 | Kuznetsov et al. | |
| 6,373,033 B1 | 4/2002 | de Waard et al. | |
| 6,411,944 B1 | 6/2002 | Ulyanov | |
| 6,423,949 B1 * | 7/2002 | Chen et al. | 219/444.1 |
| 6,496,749 B1 | 12/2002 | Yamaguchi et al. | |
| 6,501,998 B1 | 12/2002 | Pfeiffer | |
| 6,746,237 B2 | 6/2004 | Storm et al. | |
| 6,843,201 B2 | 1/2005 | Kuznetsov et al. | |
| 6,940,047 B2 * | 9/2005 | van Kesteren et al. | 219/390 |
| 2003/0027094 A1 | 2/2003 | Storm et al. | |

FOREIGN PATENT DOCUMENTS

| | | |
|---|---|---|
| EP | 10321505 | 12/1998 |
| JP | 361294812 A | 12/1986 |
| JP | 362021237 A | 1/1987 |
| JP | 63-136532 | 8/1988 |
| JP | 402034915 A | 2/1990 |
| JP | 404078130 A | 3/1992 |
| JP | 08236533 | 9/1996 |
| JP | 10321505 | 12/1998 |
| WO | WO 90/13687 | 11/1990 |
| WO | WO 98/01890 | 1/1998 |
| WO | WO 00/42638 | 7/2000 |
| WO | WO 00/68977 | 11/2000 |

* cited by examiner

DUMMY SUBSTRATE FOR THERMAL REACTOR

REFERENCE TO RELATED APPLICATIONS

This application is related to and incorporates by reference in their entireties the following: U.S. Pat. No. 6,746,237, issued Jun. 8, 2004 and U.S. patent application Ser. No. 10/713,543, filed Nov. 14, 2003.

BACKGROUND OF THE INVENTION

1. Field of the Invention

This invention relates generally to apparatuses for processing semiconductor substrates and, more particularly, to thermal reactors and methods for controlling the temperature of such reactors.

2. Description of the Related Art

Reactors which can process a substrate while suspending the substrate without directly mechanically contacting the substrate, e.g., by floating the substrate on gas cushions, have relatively recently been developed for semiconductor processing. These reactors may be called floating substrate reactors. Such a reactor is commercially available under the trade name Levitor® from ASM International N.V. of Bilthoven, The Netherlands.

In the Levitor® reactor, which is also described in U.S. Pat. No. 6,183,565 B1, the entire disclosure of which is incorporated by reference, a substrate is supported by two opposite gas flows emanating from two heated and relatively massive reactor blocks located on opposite sides of the substrate. Each reactor block typically has a heated furnace body for heating the substrate. A small gap of less than about 1 mm is typically maintained between each furnace body and a corresponding substrate surface. The small gap results in a rapid heat transfer from the reactor blocks to the substrate by conduction through the gas when the substrate is processed, e.g., during a heat treatment, or exposure to elevated temperatures. An advantage of reactors such as the Levitor® reactor is that the relatively massive reactor blocks of the reactor act as thermal "fly-wheels," resulting in a relatively stable temperature and reproducible performance.

Floating substrate reactors and methods for using such reactors for successive heat treatment of a series of planar substrates, one by one, is described in U.S. Pat. No. 6,746,237, issued Jun. 8, 2004. In those methods, the furnace bodies of the reactor blocks are typically continuously heated. After the furnace bodies have reached a desired temperature, a relatively cold substrate is placed for heat treatment in the vicinity of the furnace bodies. The typically colder substrate will withdraw heat from the furnace bodies and cause the temperature of the parts of the furnace bodies close to the substrate to decrease. The substrate is then heat treated. Because of the heat treatment time is typically relatively short in comparison to the thermal recovery time of the furnace body, the substrate is removed from the vicinity of the furnace body before the temperature of the continuously heated furnace body rises to the desired temperature again. After the temperature of the boundary surface rises to the desired temperature, another substrate is placed in the vicinity of the furnace body for heat treatment.

The methods described in U.S. Pat. No. 6,746,237 achieve a reproducible heat treatment of each of the substrates. The furnace body is at a desired temperature when a substrate is positioned for heat treatment. The substrate is removed from the vicinity of the furnace body before the temperature of the furnace body has recovered, and then the furnace body reaches the desired temperature again before positioning the next substrate in the vicinity of the furnace body for heat treatment. Thus, each substrate experiences roughly the same profile of heat treatment temperatures over time during the course of the heat treatment.

The substrates to be processed are typically provided in batches. As noted above, the ability to load successive substrates into a reactor at particular times allows a reproducible heat treatment profile to be set up. After all the substrates in a batch are processed, another batch is typically positioned for processing substrates in the reactor. This typically causes the reactor to be idle for an extended time period. Because the temperature of the reactor can drift in the time needed to position a new batch of substrates and to load a substrate from that batch into the reactor, the reactor typically must be re-initialized and set at the proper temperature before the next batch of substrates can be processed. Because of the high thermal capacity of the furnace bodies, the temperature of the reactor changes slowly and this initialization procedure can be time-consuming. Thus, the time needed for a reactor to reach the desired thermal conditions between batches can undesirably reduce the throughput of the reactor.

While described in the context of the Levitor® floating substrate reactor, the skilled artisan will appreciate that issues created by the thermal load of cold substrates can arise in other types of reactors, including a variety of hot wall reactors and/or reactors wherein a substrate is mechanically supported on a relatively massive susceptor. Furthermore, temperature overshoot issues are known to arise in many rapid thermal processing (RTP) contexts.

Accordingly, there exists a need for apparatuses and methods of controlling the temperature of a reactor to, e.g., allow for increased throughput.

SUMMARY OF THE INVENTION

According to one aspect of the invention, a method is provided for individually processing semiconductor substrates. The method comprises heating a treatment chamber to a process temperature. A substrate is loaded into the treatment chamber after the chamber reaches the process temperature. Loading the substrate decreases the chamber temperature. The chamber is heated after loading the substrate. The substrate is unloaded substrate from the treatment chamber before the chamber temperature reaches the process temperature again. A dummy substrate is loaded into the treatment chamber after the chamber temperature reaches the process temperature again. Loading the dummy substrate decreases the chamber temperature. The chamber is heated after loading the dummy substrate. The dummy substrate is unloaded from the treatment chamber before the chamber temperature reaches the process temperature an other time.

According to another aspect of the invention, a method is provided for semiconductor processing. The method comprises successively loading and unloading each of a plurality of product substrates into a reaction chamber in a series. In addition, at least one dummy substrate is automatically loaded and unloaded into the reaction chamber after successively loading and unloading the plurality of product substrates in the series.

According to yet another aspect of the invention, a method is provided for semiconductor processing. The method comprises processing a batch of silicon wafers one at a time in a single wafer reactor. At least one substitute wafer is loaded into and unloaded from the single wafer reactor after processing the batch of silicon wafers. The substitute wafer is not a silicon wafer. Subsequently, a second batch of silicon wafers is processed one at a time in the single wafer reactor.

According to another aspect of the invention, a system is provided for processing semiconductor substrates. The system comprises a single substrate reactor having a reaction chamber configured to successively heat treat a series of planar product substrates one by one in a plurality of heat treatment cycles. The system also comprises one or more dummy substrates and a dummy substrate storage station proximate the reactor for storing the one or more dummy substrates. A substrate transport device is also provided and configured to automatically load and unload at least one dummy substrate into the reaction chamber after successively heat treating the series of product substrates.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENTS

Figure 1:
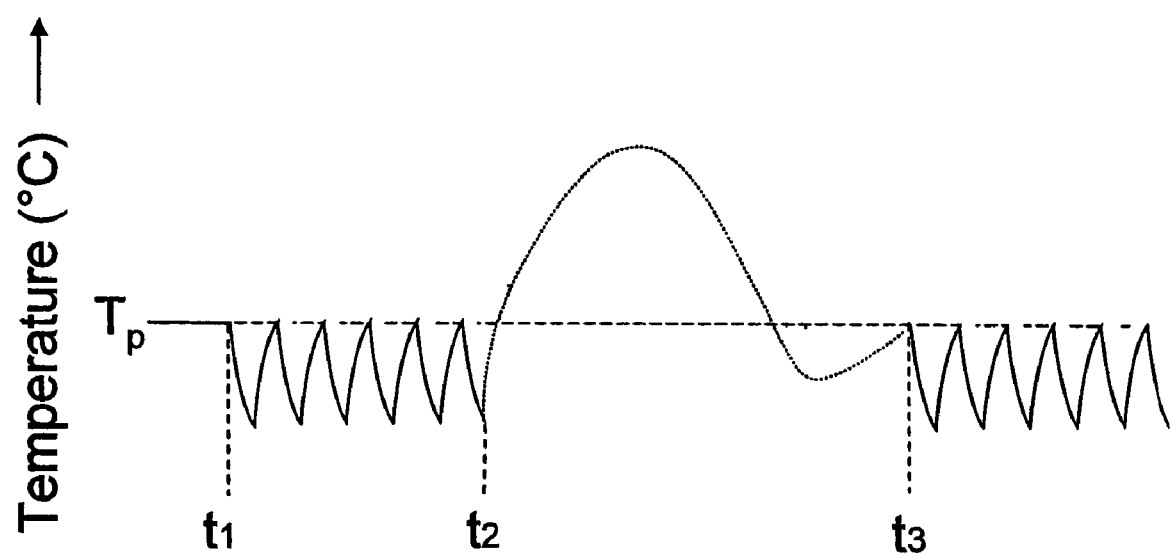
FIG. 1 shows a temperature-time plot for the processing of two batches of substrates with the reactor idle between batches.

As discussed in U.S. Pat. No. 6,746,237, the disclosure of which is incorporated herein by reference in its entirety, a relatively steady state situation can be established when sequentially processing a batch, or series, of substrates in a single substrate thermal reactor, i.e., a reactor that processes a substrate at elevated temperatures relative to ambient temperatures. Such a situation is illustrated in FIG. 1, which shows the sequential processing of two batches of six product substrates, i.e., substrates from which a final product such as an integrated circuit is made. A first substrate is loaded into the reaction or treatment chamber of a reactor at $t_1$, when the treatment chamber reaches a desired process temperature $T_p$. Because the substrate is typically at a lower temperature than the treatment chamber, it will absorb thermal energy and cause a dip in the reactor temperature after loading. The treatment chamber can be continuously heated to compensate for this temperature drop. After a desired processing time elapses, the substrate is removed and the temperature of the treatment chamber rises to the temperature $T_p$ again. At that point another substrate is loaded into the reactor and the process is repeated. As a result, the treatment chamber is at a relatively steady state, with heat being supplied to the treatment chamber at a relatively constant rate, while the loading and unloading of substrates causes the temperature of the treatment chamber to alternate predictably and periodically between temperature $T_p$ and a temperature lower than $T_p$. At time $t_2$ the last of the processed substrates from the first batch is unloaded from the reactor.

With continued reference to FIG. 1, it has been found that the relatively steady state situation cannot typically be maintained when processing multiple batches of substrates. Because the blocks heating the treatment chamber have a high thermal capacity, they can take a long time to bring up to $T_p$. Thus, the blocks are usually continuously heated, even in the time between processing of two batches of substrates, i.e., from $t_2$ to $t_3$, while the first batch is transported out of the loading area and the second batch is loaded in. Without the thermally absorptive load presented by a substrate, however, the temperature of the treatment chamber typically continues to rise beyond $T_p$ to an overshoot temperature after the last of a batch of substrates is removed and before a substrate from a second batch of substrates is loading into the treatment chamber. Decreasing heat supplied to the blocks can compensate for this overshoot. However, due to the high thermal capacity of the thermal blocks, the treatment chamber cools slowly and it will take some time before the system has reached temperature $T_p$ again and is ready for loading the first substrate of a next batch at time $t_3$. Thus, processing time can be lost while waiting for the treatment chamber to come to $T_p$.

Advantageously, preferred embodiments of the invention allow the relatively steady state situation discussed above to be maintained in the period of time between processing of different batches of substrates; one or more "dummy" substrates are used to provide a thermal load for a thermal reactor between processing of batches of substrates. The dummy substrate(s) preferably each have approximately the same thermal properties and size as the product substrates. After a batch of wafers is processed, a dummy substrate can be loaded and unloaded in the same manner as a product substrate. By using the dummy substrate(s) as a substitute for the thermal load provided by a product substrate, the dummy substrate(s) can approximate a case in which an infinitely long series of substrates is processed without the interruptions caused by changing substrate batches and the relatively steady state situation discussed above can be maintained in the interim between processing of different batches of substrates. Thus, the temperature overshoot discussed above can be alleviated. Advantageously, time waiting for the treatment chamber to cool from the overshoot temperature to $T_p$ can be eliminated, thereby increasing throughput.

Preferably, the dummy substrates are part of the processing system and at least one is automatically loaded into the treatment chamber at least once after a batch of substrates has been processed, without any prompting by a human operator. This automatic loading advantageously ensures that the treatment chamber is maintained at the proper processing conditions no matter how long the time lag between processing of different batches of substrates is. Moreover, the possibility of improper dummy substrate use due to human error or inattentiveness can be eliminated.

Reference will now be made to the Figures, wherein like numerals refer to like parts throughout.

Figure 2:
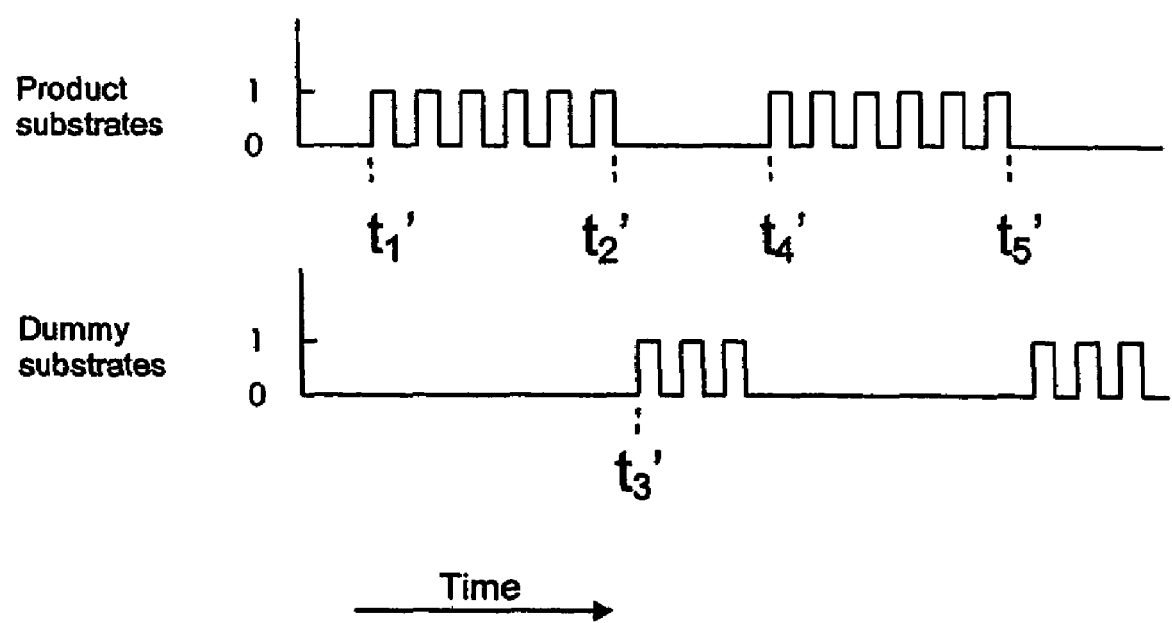
FIG. 2 shows a plot of the loading of dummy substrates and two batches of substrates into a reactor with the reactor heating dummy after each batch, in accordance with preferred embodiments of the invention.
Figure 3:
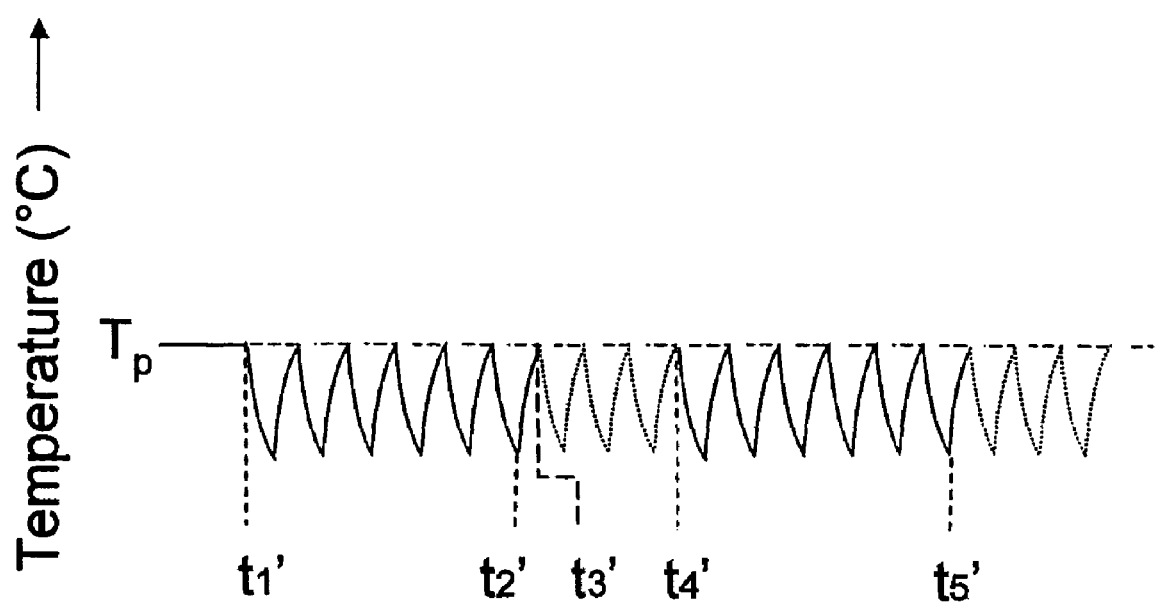
FIG. 3 shows a temperature-time plot of treatment chamber temperatures resulting from the processing scheme of FIG. 2, in accordance with preferred embodiments of the invention.

FIGS. 2 and 3 show the loading and unloading of substrates and dummy substrates into a reactor according to preferred embodiments of the invention. In FIG. 2, "1" indicates a loaded treatment chamber and "0" indicates an unloaded treatment chamber. With reference to both FIGS. 2 and 3, the first substrate of a first substrate batch is loaded at time $t_1'$. Each of the substrates in the first batch is successively loaded and unloaded into the treatment chamber and the last substrate of the first batch is unloaded at $t_2'$.

It will be appreciated that between $t_2'$ and $t_4'$, the first batch of processed substrates is removed from a loading position (e.g., in a transfer chamber or zone) and the second batch of substrates is put in position for loading individual substrates into the reactor. Between $t_2'$ and $t_4'$, one or more dummy substrates are used as substitutes for the product substrates to provide thermal loads for the reactor, as discussed above. Accordingly, after $t_2'$, when the system reaches $T_p$ again, a dummy substrate is loaded into the system at $t_3'$. The dummy substrate is preferably loaded and unloaded from the treatment chamber in the same manner as a product substrate, as discussed below, to approximate the thermal behavior of a processing a product substrate. If the switching time of batches of substrates is long enough, a plurality of dummy wafers are loaded and unloaded in cycles. These cycles of loading and unloading one or more dummy substrates preferably prevent the treatment chamber temperature from overshooting $T_p$. The cycles are preferably repeated until the next batch of substrates is in position for loading individual product substrates into the treatment chamber. At that point, at $t_4'$, the first substrate of the second batch is loaded into the treatment chamber.

Although three cycles of loading and unloading a dummy substrate are shown in the exemplary embodiment of FIG. 3, it will be appreciated that more or fewer cycles can be performed and that the same or different dummy substrates can be used for each cycle. In cases where the same dummy substrate is used, the dummy substrate is allowed to cool after unloading, so that it can present a sufficient thermal load for the treatment chamber after being loaded into the chamber again. In other embodiments, two or more dummy substrates can be used for loading into the treatment chamber between $t_3'$ to $t_4'$. Such an arrangement advantageously allows for a longer cooling period, which may be desirable in cases in which the substrate cannot sufficiently cool before the system reaches $T_p$ again and another dummy substrate is to be loaded.

In other embodiments, a cooling station can be provided to actively cool the substrate to achieve a desired cooling rate. For example, in single wafer hot wall systems, the presence of a cool-down station is desirable to cool down the product substrates. This cool-down station can advantageously be used to also cool down the dummy substrate so that it is ready for re-loading in time.

Figure 4:
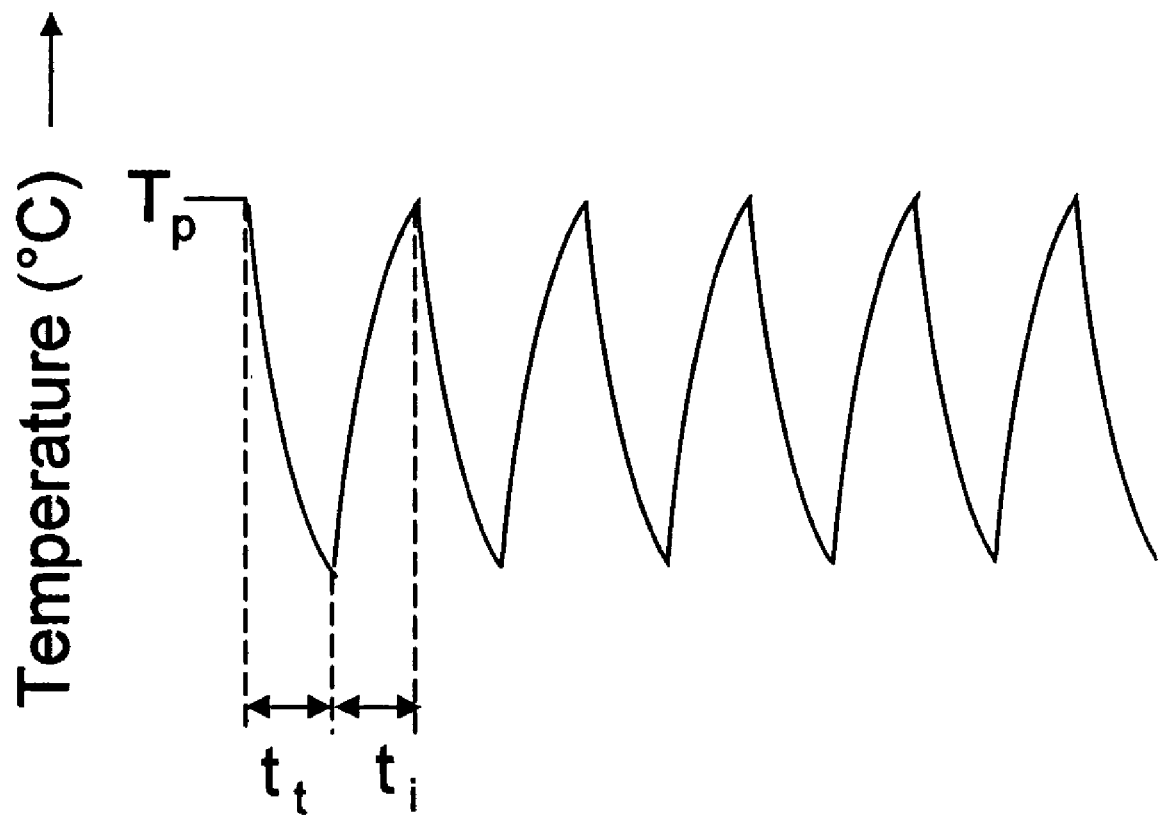
FIG. 4 shows a temperature-time plot showing the effects of sequentially loading and unloading substrates or dummy substrates, in accordance with preferred embodiments of the invention.

FIG. 4 shows, in greater detail, a preferred timing for loading and unloading a plurality of product substrates and/or dummy substrates. Each product substrate preferably resides in the thermal treatment chamber during a treatment time $t_r$. During this time, the product substrate or dummy substrate absorbs heat and cools the treatment chamber. It will be appreciated that the treatment time $t_r$ is preferably chosen based upon the requirements of a particular process and particular process temperatures. For example, for a copper anneal, $t_r$ is preferably 0.2 seconds or longer and, more preferably, 1 second or longer. Preferably, the process temperature $T_p$ is between about 200° C. and about 1100° C.

After a desired processing duration and preferably before the treatment chamber again reaches $T_p$, the product substrate is unloaded. In this period, the treatment chamber is idle, i.e., not processing a substrate within it, for a time $t_i$. In some preferred embodiments, it will be appreciated that the time needed to remove a substrate from the treatment chamber is preferably about 2 seconds or less and, more preferably, about 1.3 seconds or less. Time $t_i$, however, can be longer than this, depending on the configuration of the reactor and the rate at which the treatment chamber can be heated. The time $t_i$, however, is preferably at least as long as the substrate removal time.

With continued reference to FIG. 4, without the thermal load presented by a product substrate or dummy substrate, the treatment chamber, which is preferably continuously heated, again reaches $T_p$. When the sequential processing of the series of product substrates is completed, the system automatically continues with loading a dummy substrate into the thermal treatment chamber and with keeping the dummy substrate in the treatment chamber during a time $t_r$. Then the dummy substrate is removed from the chamber and the chamber is left empty during a time $t_i$, during which the dummy substrate can cool down. Then a dummy substrate is loaded into the chamber again and the sequence is repeated. This sequence can be repeated until the next series of product substrates is available for processing.

Preferably, the materials and size of the dummy substrate or substrates are chosen to approximate the thermal load presented by a product substrate. More preferably, the dummy substrates each have approximately the same dimensions as the product substrates, so that handling and processing systems do not need to be changed to accommodate the dummy substrates. In some embodiments, the dummy substrates can be formed of the same material as the product substrates, except that the dummy substrates are retained in the processing system for use as dummy substrates, rather than transported away and subjected to further processing. For example, where the product substrates are silicon wafers, the dummy substrates can also be silicon wafers.

In addition to approximating the thermal properties of a product substrate, however, the dummy substrates are preferably formed of a durable material that allows them to withstand many cycles of loading and unloading into a treatment chamber and the resulting changes in temperature. For example, where the product wafers are silicon wafers, the dummy wafers are preferably formed of quartz, which has been found to have adequately similar thermal behavior to a silicon wafer, with the additional advantage that a quartz wafer has a much higher resistance against thermal shock, resulting in a lifetime of many more cycles than a silicon wafer. It has been found that, while a quartz wafer has a heat capacity that is somewhat different from the heat capacity of a silicon wafer, the quartz dummy wafer is nevertheless effective in creating a steady state situation. It will be appreciated that in processing systems that use optical sensors to detect a substrate, the quartz dummy substrates can be coated with a layer of polysilicon of about 100 to about 200 nm thick to render the dummy substrate detectable by the sensors.

Preferably, the temperature in the thermal treatment chamber is measured close to the substrate. In this way the loading of a cold substrate can be detected through the occurrence of a temperature dip. In some embodiments, as discussed above, a substrate (product substrate or dummy substrate) is inserted into the thermal treatment chamber at the moment that the temperature, measured close to the substrate, reaches a predetermined temperature. Loading the substrate causes a temperature dip and the substrate is removed from the chamber before the predetermined temperature has been reached again. When the dummy substrate has a slightly smaller or higher heat capacity than the product substrates, it can cause a slightly smaller or larger dip and will take a shorter or longer time before the predetermined temperature is reached again. Nevertheless, so long as the dummy substrate has a sufficiently high heat capacity to absorb some heat, to preferably lower the temperature of the treatment chamber, a temperature overshoot above the process temperature can advantageously be prevented.

Figure 5:
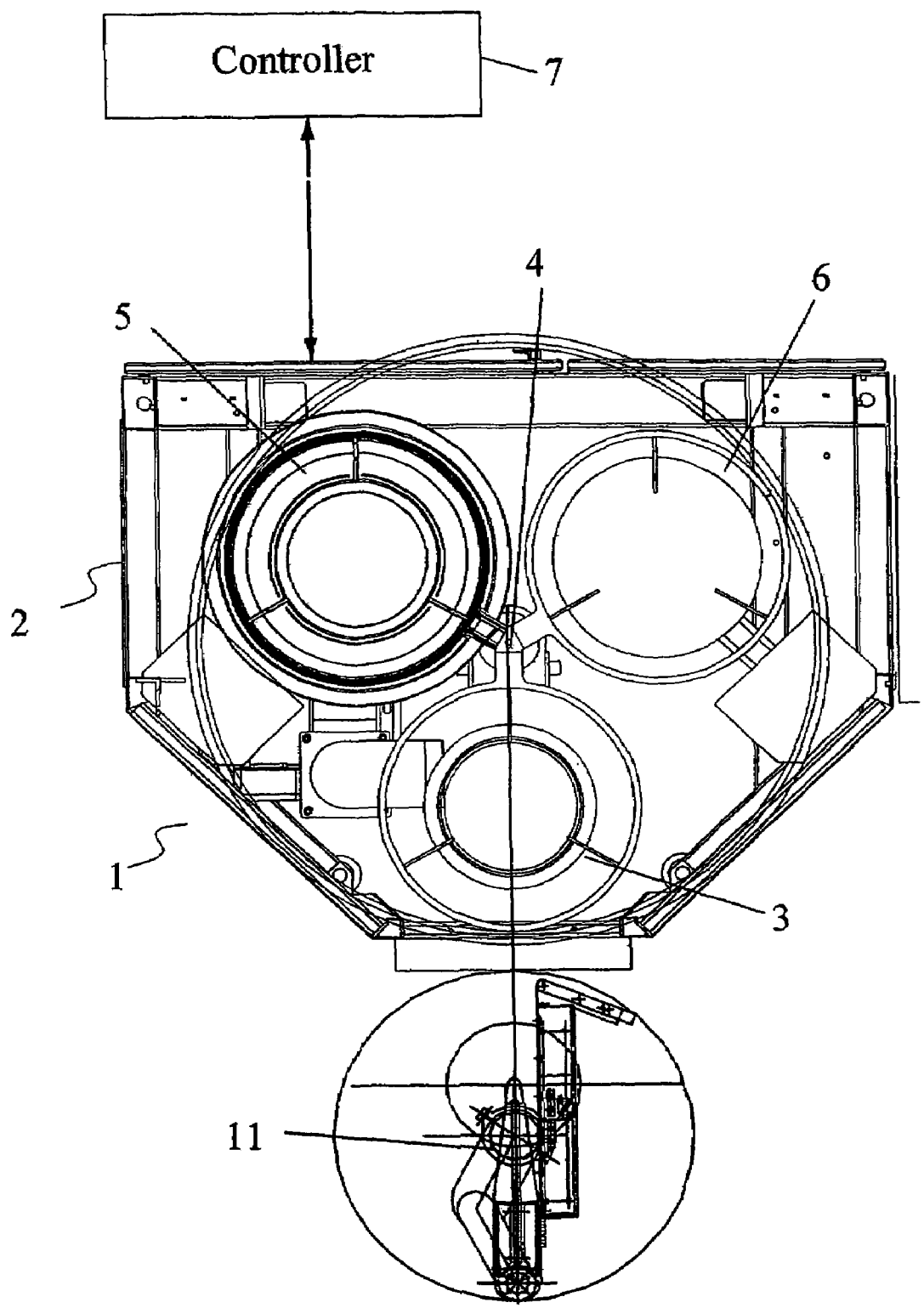
FIG. 5 shows a plan view of a processing system in accordance with preferred embodiments of the invention.

An exemplary single substrate reactor system 1 according to the preferred embodiments is shown in FIG. 5. The system comprises three stations: 1) a substrate feed/discharge station 3; 2) a furnace station 5 having a treatment chamber; and 3) a cool-down station 6. A substrate transport device 4 comprising a ring structure for supporting a substrate transports the substrate from one station to another. Although a ring structure is shown in each of the station positions for illustration purposes, in preferred embodiments only one ring structure is present for transporting the wafer sequentially from one station to another. It will be appreciated that the furnace 5, substrate feed/discharge station 3 and cool-down station 6 are enclosed by walls 2, which form a common chamber to enclose the furnace 5, substrate feed/discharge station 3, the cool-down station 6 and the substrate transport device 4.

Batches of substrates can be provided to the system 1 in cassettes (not shown) and substrate handling robot 11 transports a substrate from/to a cassette to/from the substrate feed/discharge station 3. Individual substrates of a batch can be positioned on a support ring at the feed/discharge station 3. The transport device 4 rotates to load the substrate into the furnace 5. After processing, the transport device 4 further rotates to position the substrate at the cooling station 6 and then, after the substrate has been cooled down, to the substrate feed/discharge station 3.

It will be appreciated that a dummy substrate 8 can be positioned in a storage station or position, until needed. When needed, the dummy substrate 8 can be positioned on the ring of the transport devise 4 to be alternately cycles between the furnace 5 and cool-down station 6.

In some embodiments, the storage position for the dummy substrate(s) can be a dedicated storage station for the dummy substrate and the dummy substrate is transported from the storage station to the feed/discharge station 3 by the substrate handling robot 11. In other embodiments, the storage position can be a slot in a cassette for dummy substrates. While product substrates are being processed, the dummy substrate(s) 8 can be stored in the cassette. After all product substrates have been processed, a dummy substrate is loaded into the furnace 5 and the cassette with processed product substrates can be transported to another location for further processing. Another cassette with product substrates can then be positioned for loading and processing. The dummy substrate(s) can be returned and stored in the cassette for dummy substrates, and processing of the product substrates can be resumed. In a preferred embodiment, the feed/discharge station 3 is also the storage station for the dummy substrate. This ensures that the dummy substrate is always available when needed. Preferably, the feed/discharge station 3 has a dummy substrate storage position which is vertically separated from the ring structure of transport device 4 and the dummy substrate is positioned on the transport device 4, e.g., by the substrate handling robot 11, when needed.

A controller 7 includes software to control, among other things, robotics for loading and unloading the product and dummy substrates. The controller 7 preferably causes at least one dummy substrate to be loaded into the furnace 5 automatically after a batch of substrates is processed. Thus, no operator input is required and there is no need to test for particular idle chamber conditions to trigger loading of a dummy substrate.

Figure 6:
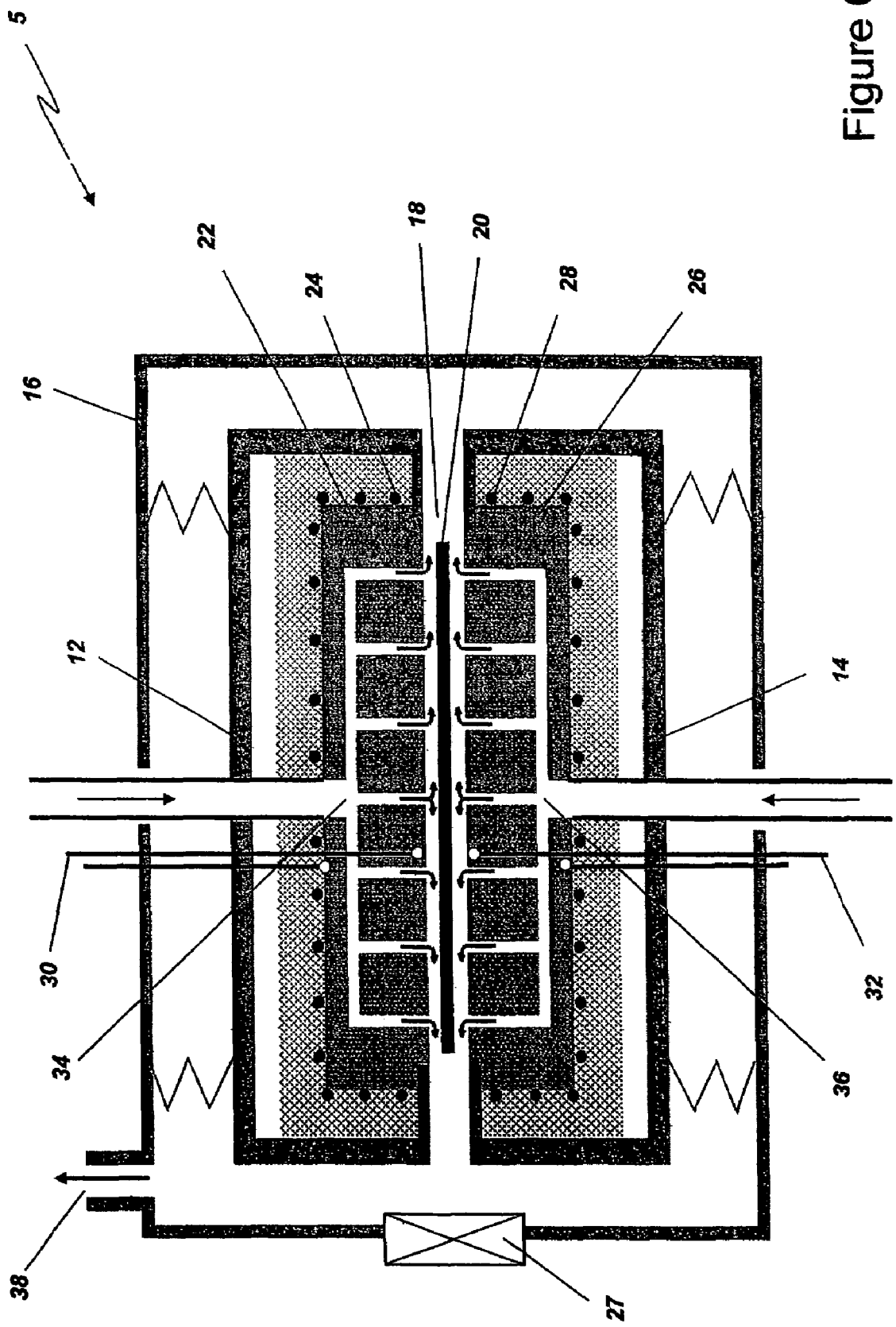
FIG. 6 is a schematic cross-section showing the treatment of a in an exemplary floating substrate reactor, in accordance with preferred embodiments of the invention.

FIG. 6 shows, in greater detail, the furnace 5. The furnace includes an upper block 12 and a lower block 14 that are in a housing 16. The surfaces of the blocks 12 and 14 facing each other define a chamber 18 for processing or treating a substrate 20. The upper block 12 comprises an upper furnace body 22 and a resistive heater, e.g., a heating coil, or furnace body heater 24. Similarly, the lower block 14 comprises a lower furnace body 26 and a heating coil 28 to provide heat to the treatment chamber 18. The heaters 24 and 28 heat the furnace bodies 22 and 26, respectively, to heat the treatment chamber 18. Preferably, heaters 24 and 28 establish a first and second relatively steady thermal gradient across the furnace bodies 22 and 26, respectively, to the treatment chamber 18, so that the heat flows through the furnace bodies towards chamber 18 compensate for the heat withdrawn from chamber 18 by inserting the cold substrates 20 and so that various substrates 20 of a batch of substrates experience substantially the same heating profile after being loaded into the chamber 18. Preferably, the first and second thermal gradients are roughly equal. For temperature stability, the mass of each of the furnace bodies 22 and 26 is preferably at least about 10 and, more preferably, about 40 times the mass of a product substrate 20.

Substrates 20 are loaded and unloaded through the door 27. It will be appreciated that the distance between the upper and lower blocks 12 and 14 is increased to allow for this loading and unloading. The door 27 is closed and the distance between the blocks 12 and 14 is decreased for a heat treatment, as illustrated in FIG. 6. A small gap of less than about 2 and, more preferably, less than about 1 mm is typically maintained between each block 12 and 14 and a corresponding substrate surface in the closed process position, to facilitate heat transfer.

The upper block 12 is preferably provided with at least one temperature sensor 30 and the lower block 14 is preferably also provided with at least one temperature sensor 32 to measure the treatment chamber temperature and detect the temperature drop caused by loading of the substrate 20. It will be appreciated that the representation of the upper and lower blocks 12 and 14 has been simplified for ease of illustration. It will be understood that, preferably, a plurality of temperature sensors 30 and 32 and a plurality of independent heated zones can be provided in the upper and lower blocks 12 and 14. Such an arrangement is disclosed in U.S. patent application Ser. Nos. 10/141,517 and 10/410,699, the entire disclosures of which are incorporated by reference herein. Also the ring structure of the transport device 4, surrounding substrate 20, is not shown in FIG. 6. During processing, ring structure 4 is accommodated in recesses in furnace bodies 26 and 22. The ring structure of the transport device 4 is described in more detail in U.S. patent application Ser. No. 10/009,851, the entire disclosure of which is incorporated by reference herein.

Process gases (including inert gases) are preferably supplied both from the upper block 12 through gas passages 34 and the lower block 14 through gas passages 36. The gases can be exhausted through an exhaust opening 38 formed in the reactor housing 16. The passages 34 and 36 are advantageously configured to float the substrate 20 on gas cushions during a substrate treatment. During processing of a batch of substrates, the substrate 20 can be a product substrate and between processing of batches of substrates, the substrate 20 can be a dummy substrate.

It will be appreciated that processing according to the preferred embodiments using one or more dummy substrates allows for numerous advantages. For example, the thermal treatment chamber can be maintained in a similar condition both during processing of a series of substrates and in the time between processing of different series of substrates. In some cases, the first and the second thermal gradients of the upper and lower furnace bodies can be maintained at a substantially constant level during processing a batch of substrates and during the time between processing two subsequent batches, while also achieving, periodically, the chamber temperature at the process temperature. Although the temperature of the reactor station is changed periodically by inserting the cold substrates, averaged over time, a roughly steady state condition is maintained. It should be noted that this so-called steady state condition is in fact fairly dynamic, to be compared with, e.g., the roughly stable position of a water skier on a water surface. Thus, the need to re-initialize the reactor for each series of substrates can effectively be eliminated, e.g., the system no longer needs a cool down time due to overshooting the process temperature.

It will also be appreciated that the ability to maintain a reactor in a steady state condition can be particularly advantageous in a hot wall system. Hot wall systems typically have walls or other parts with a high heat capacity in order to maintain a relatively constant temperature during multiple process runs, e.g., runs with different wafers, so that time is not wasted in cycling the furnace temperature through large swings. Hot wall furnaces have typically been used for relatively long thermal treatments and lamp based systems have been used for processing of short duration with high ramp-up rates. Advantageously, the present invention facilitates use of a hot wall furnace for rapid thermal processing. Typically, as a result of starting the sequential loading of a series of cold substrates into the hot wall reactor, the temperature of the treatment chamber and the thermal gradients across the walls from the heater to the interior of the chamber change. It can take a significant amount time before a so called steady state condition has established itself again. In some systems, when, after an idle time in which no substrates have been processed, the processing of a series of substrates is started, it may take a few substrates before a new steady state condition is established. In contrast, by maintaining the reactor during the idle time in roughly the same condition as during processing, e.g., by maintaining the thermal gradient across a heating block from its heaters to the treatment chamber at a substantially constant value throughout, the time needed for the reactor to re-establish a steady state condition, after a new batch is positioned for loading, can be minimized. Moreover, the uniformity of process results across a batch of substrates can be improved, because the first few substrates of a batch are no longer exposed to a temperature profile different from later substrates in the batch.

In addition, the use of dummy wafers advantageously facilitates changing the desired process temperature between batches of substrates. For example, during cycling of the dummy substrates, the temperatures can be changed gradually to the desired temperatures for a next sequence of substrates. Such a scheme is especially helpful in cases where an Advanced Process Control (APC) system is used to change the temperature after each sequence of substrates. As known in the art, APC systems provide automatic control of a manufacturing process based upon a manufacturing model, which is typically contained in a software program. Advantageously, the dummy substrates provide a predictable thermal load which aids in efficiently adjusting the temperature. This predictability allows temperatures to be more quickly and accurately increased or decreased.

It will be appreciated that, while shown with six substrates per batch for ease of illustration, the substrate batches can include more or fewer than six substrates. For example, in some embodiments, 25 substrates or more per batch can be provided in, e.g., a front opening unified pod (FOUP). In addition, while particularly advantageously applied to hot-wall reactors in which a treatment chamber is heated principally by heating its walls, the reactors can also be cold-wall single substrate reactors which have walls that are transparent to heat radiation. In such cases, a dummy substrate can still advantageously be loaded into the reactor to provide a thermal load and to modulate chamber (and particularly susceptor) temperatures. Also, while heat energy can be provided to the reaction chamber at the same rate throughout processing for ease of process control, it will be appreciated that the heat supplied at the reaction chamber can vary over the course of processing. For example, heat loss due to opening the reaction chamber for the insertion of a substrate and the absorption of heat by cold substrates can be compensated for by momentarily increasing power to the reactor heaters to increase the heat energy provided to the reaction chamber. Moreover, the power provided to the heaters can be changed to alter the throughput of the reactor as desired. For example, throughput can be increased by increasing the power, thereby exposing a substrate to a particular quantity of heat in a shorter time period.

Accordingly, it will be appreciated by those skilled in the art that other various omissions, additions and modifications can be made to the processes and apparatuses described above without departing from the scope of the invention. All such modifications and changes are intended to fall within the scope of the invention, as defined by the appended claims.

I claim:

1. A method for individually processing semiconductor substrates, comprising:

heating a treatment chamber to a process temperature;

subsequently establishing a substantially steady state thermal condition in the treatment chamber by subjecting a series of semiconductor substrates to a semiconductor fabrication process, wherein establishing the substantially steady state thermal condition comprises the steps of:

A. loading a semiconductor substrate into the treatment chamber when a chamber temperature of the chamber reaches the process temperature, wherein loading the semiconductor substrate decreases the chamber temperature;

B. increasing the chamber temperature after loading the semiconductor substrate;

C. unloading the semiconductor substrate from the treatment chamber before the chamber temperature reaches the process temperature again; and D. repeating steps A, B and C until all of the series of semiconductor substrates is subjected to the semiconductor fabrication process; and maintaining the substantially steady state thermal condition after subjecting the series of semiconductor substrates to the semiconductor fabrication process, wherein maintaining the substantially steady state thermal condition comprises performing the steps of:

E. loading a dummy substrate into the treatment chamber when the chamber temperature reaches the process temperature again, wherein loading the dummy substrate decreases the chamber temperature;

F. increasing the chamber temperature after loading the dummy substrate;

G. unloading the dummy substrate from the treatment chamber before the chamber temperature reaches the process temperature an other time; and H. repeating steps E, F and G until subjecting a first of an other series of semiconductor substrates to a semiconductor fabrication process in the treatment chamber, wherein the treatment chamber is continuously heated during steps A–H.

2. The method of claim 1, further comprising:

loading an other substrate into the treatment chamber after unloading the dummy substrate and after the chamber temperature reaches the process temperature, wherein loading the other substrate decreases the chamber temperature;

heating the chamber after loading the other substrate; and unloading the other substrate from the treatment chamber before the chamber temperature again reaches the process temperature.

3. The method of claim 2, wherein the wall is continuously heated from at least loading the substrate to loading the other substrate.

4. The method of claim 1, wherein the chamber temperature is measured by a temperature sensor in a wall defining the chamber.

5. The method of claim 1, wherein heating a treatment chamber to a process temperature and heating the chamber after loading the substrate comprise heating the walls with resistive heaters.

6. The method of claim 5, further comprising momentarily increasing a power to the heaters after loading the substrate and after loading the dummy substrate.

7. The method of claim 1, further comprising loading and unloading a dummy substrate from the chamber a plurality of times before loading the other substrate into the treatment chamber.

8. The method of claim 7, wherein loading and unloading the dummy substrate from the chamber a plurality of times comprises loading and unloading the same dummy substrate each time.

9. The method of claim 1, wherein the process temperature is between about 200° C. and about 1100° C.

10. The method of claim 9, wherein the process temperature is about 1000° C. or more.

11. The method of claim 1, wherein the length of time between loading a substrate into the treatment chamber and unloading the substrate from the treatment chamber is about 1.3 seconds or more.

12. The method of claim 11, wherein the length of time is about 2.0 seconds or more.

13. The method of claim 1, wherein the substrate is retained in the reaction chamber for 0.2 seconds or longer.

14. The method of claim 13, wherein the substrate is retained in the reaction chamber for 1 second or longer.

15. A method for semiconductor processing, comprising:

successively loading and unloading each of a plurality of product substrates into a reaction chamber in a series, wherein successively loading and unloading each of the plurality of product substrates establishes a substantially steady state thermal condition in the reaction chamber;

successively loading and unloading each of an other plurality of product substrates into the reaction chamber in a second series; and automatically loading and unloading at least one dummy substrate into the reaction chamber after successively loading and unloading the plurality of product substrates and before successively loading and unloading the other plurality of product substrates, thereby maintaining the substantially steady state thermal condition in a time between successively loading and unloading each of the plurality of product substrates and successively loading and unloading each of the other plurality of product substrates.

16. The method of claim 15, further comprising changing a reaction chamber temperature during automatically loading and unloading the dummy substrate.

17. The method of claim 15, wherein the reaction chamber is defined between an upper furnace body and a lower furnace body, wherein the upper and lower furnace bodies each comprise a plurality of holes, further comprising processing each of the product substrates in the reaction chamber by injecting gas into the chamber from the holes to suspend the product substrate on a gas cushion.

18. The method of claim 17, wherein injecting gas into the chamber suspends each of the product substrates less than about 1 mm from a surface of the upper furnace body or lower furnace body.

19. The method of claim 15, wherein the plurality of product substrates comprises 25 wafers or more.

20. The method of claim 15, wherein the dummy substrate comprises quartz having the same size and shape as one of the product substrates.

21. The method of claim 20, wherein the dummy substrate is coated with a layer of polysilicon.

22. A method for semiconductor processing, comprising:

heating a process chamber of a single wafer reactor to a desired process temperature;

processing a batch of silicon wafers one at a time in the process chamber after the process chamber reaches the desired process temperature, wherein processing the batch of silicon wafers establishes a substantially regular profile of process chamber temperature as a function of time;

loading and unloading at least one substitute wafer into the single wafer reactor after processing the batch of silicon wafers, wherein the substitute wafer is not a silicon wafer;

repeating loading and unloading the at least one substitute wafer into and out of the process chamber until a second batch of silicon wafers is available for loading into the process chamber; and subsequently processing the second batch of silicon wafers one at a time in the process chamber, wherein the substantially regular profile of process chamber temperature is maintained between processing the batch of silicon wafers and subsequently processing the second batch of silicon wafers.

23. The method of claim 22, wherein loading and unloading at least one substitute wafer comprises successively loading and unloading a plurality of substitute wafers into the process chamber one at a time.

24. The method of claim 22, wherein the substitute wafer is formed of quartz.

25. The method of claim 22, wherein the process chamber comprises at least one block having a block boundary surface and a block heater spaced from the block boundary surface, wherein during processing a major surface of the processed silicon wafer is disposed parallel to and in proximity of the block boundary surface and the block boundary surface extends beyond substantially the entire major surface of the silicon wafer.

26. The method of claim 25, wherein loading and unloading at least one substitute wafer comprises maintaining substantially steady a thermal gradient between the block heater and the block boundary surface.

27. The method of claim 25, further comprising resistively heating the at least one block.

28. The method of claim 27, wherein resistively heating comprises heating the at least one block to a temperature between about 200° C. and about 1100° C.

29. The method of claim 28, further comprising a second block spaced from the at least one block, wherein the at least one block and the second define block the process chamber therebetween, wherein the upper and lower blocks are at the same temperature.

30. The method of claim 25, wherein the at least one block has a mass greater than about 10 times a mass of each of the product substrates.

31. The method of claim 30, wherein the mass is greater than about 40 times a mass of each of the product substrates.

32. The method of claim 15, wherein automatically loading and unloading at least one dummy substrate is repeated until the other plurality is available for loading into the reaction chamber.

33. The method of claim 1, wherein the treatment chamber is a hot wall treatment chamber.

34. The method of claim 33, wherein a hot wall of the treatment chamber has a thermal gradient established between a surface of the wall closest to a heater and a surface of the wall delimiting a volume accommodating the semiconductor substrates, and further comprising:

maintaining the thermal gradient substantially constant throughput steps A–H.

35. The method of claim 1, further comprising:

forming integrated circuit products from the semiconductor substrates after subjecting the series of semiconductor substrates to the semiconductor fabrication process;

maintaining the dummy substrate within a processing system containing the treatment chamber; and loading the same dummy substrate into the treatment chamber between subjecting each a plurality of other series of semiconductor substrates to semiconductor fabrication processes in the treatment chamber.

* * * * *